(12) United States Patent
Wang et al.

(10) Patent No.: US 6,306,980 B1
(45) Date of Patent: Oct. 23, 2001

(54) RESIN COMPOSITES AND METHOD FOR PRODUCING THE SAME

(75) Inventors: Dong Dong Wang; Motoo Asai, both of Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/552,642

(22) Filed: Apr. 19, 2000

Related U.S. Application Data

(62) Division of application No. 09/258,199, filed on Feb. 26, 1999, now Pat. No. 6,124,408, which is a continuation of application No. 08/941,397, filed on Sep. 30, 1997, now Pat. No. 5,994,480, which is a continuation of application No. 08/594,371, filed on Jan. 30, 1996, now abandoned, which is a continuation of application No. 08/200,522, filed on Feb. 23, 1994, now abandoned.

(30) Foreign Application Priority Data

Feb. 24, 1993 (JP) ........................................................ 5-58078
May 19, 1993 (JP) ..................................................... 5-139168

(51) Int. Cl.$^7$ .................................................. C08F 283/00

(52) U.S. Cl. ...................... 525/523; 525/189; 525/534; 525/535

(58) Field of Search .................................. 525/189, 523, 525/534, 535

(56) References Cited

U.S. PATENT DOCUMENTS

| | | |
|---|---|---|
| 3,763,088 | 10/1973 | Izawa et al. . |
| 3,878,019 | 4/1975 | Chapman et al. . |
| 4,291,087 | 9/1981 | Warburton, Jr. . |
| 4,369,208 | 1/1983 | Okunaka et al. . |
| 4,547,455 | 10/1985 | Hiramoto et al. . |
| 4,675,252 | 6/1987 | Hashimoto et al. . |
| 4,752,499 | 6/1988 | Enomoto . |
| 4,883,744 | 11/1989 | Feilchenfeld et al. . |
| 4,954,195 | 9/1990 | Turpin . |
| 4,972,031 | 11/1990 | Choate et al. . |
| 4,987,165 | 1/1991 | Orikasa et al. . |
| 5,002,821 | 3/1991 | Browne et al. . |
| 5,021,472 | 6/1991 | Enomoto . |
| 5,045,418 | 9/1991 | Fukuyoshi . |
| 5,055,321 | 10/1991 | Enomoto et al. . |
| 5,106,906 | 4/1992 | Meier et al. . |
| 5,106,918 | 4/1992 | Karasz et al. . |
| 5,134,047 | 7/1992 | Inada et al. . |
| 5,231,150 | 7/1993 | McGrail et al. . |
| 5,276,106 | 1/1994 | Portelli et al. . |
| 5,278,224 | 1/1994 | Olesen et al. . |
| 5,344,893 | 9/1994 | Asai et al. . |
| 5,364,914 | 11/1994 | Choate et al. . |
| 5,434,224 | 7/1995 | McGrail et al. . |
| 5,519,177 | 5/1996 | Wang et al. . |

FOREIGN PATENT DOCUMENTS

| | | |
|---|---|---|
| 0133357 | 2/1985 | (EP) . |
| 0361247 | 4/1990 | (EP) . |
| 0361400 | 4/1990 | (EP) . |
| 0365168 | 4/1990 | (EP) . |
| 0311349 | 4/1999 | (EP) . |
| 4154860 | 5/1992 | (JP) . |

OTHER PUBLICATIONS

Chemical Patent Index, Documentation Abstracts Journal, Week 9228, Sep. 9, 1992, Derwent Publications, Ltd. London, GB, (AN 92–230636(28) ).

*The Plastic Book*, published by Plastics Age, pp. 162–163(1987).

(List continued on next page.)

Primary Examiner—Helen L. Pezzuto
(74) Attorney, Agent, or Firm—Greenblum & Bernstein, P.L.C.

(57) ABSTRACT

A novel resin composite consists of a thermosetting resin or photosensitive resin and a thermoplastic resin and has a guasi-homogeneous compatible structure not only having properties inherent to the thermosetting or photosensitive resin but also exhibiting values of properties higher than those inherent to the thermoplastic resin.

20 Claims, 10 Drawing Sheets

OTHER PUBLICATIONS

*Encyclopedia of Practical Plastics*, published by Sangyo Chosakai, p. 455 (1993).

Yamanaka et al., Structure Development in Epoxy Resin Modified with Poly (ethersulphone), Polymer, 1989, vol. 30, Apr., pp. 662–667.

Youqing et al., Study on the Epoxy Resin System Modified Using Polyethersulphone, 34 the International SAMPE Symposium, May 8–11, 1989, pp. 875–883.

Bucknall et al., Phase Separation in Crosslinked Resins Containing Polymeric Modifiers, Polymer Engineering and Science, Mid–Jan., 1986, vol. 26, No. 1, pp. 54–62.

Database WPI, Derwent Publications Ltd. Derwent Abstract No. 85–033554 of JP 59226074, filed Dec. 19, 1994.

Mackinnon et al., "A Dielectric, Mechanical, Rheological, and Electron Microscopy Study of Cure and Properties of a Thermoplastic–Modified Epoxy Resin", *Macromolecules*, 25, pp. 3492–3499 (1992).

English language translation of *The Plastic Book* (1987), from p. 162, col. 1, line 1 to col. 2, line 6.

1 μm

1 μm 0.1 μm

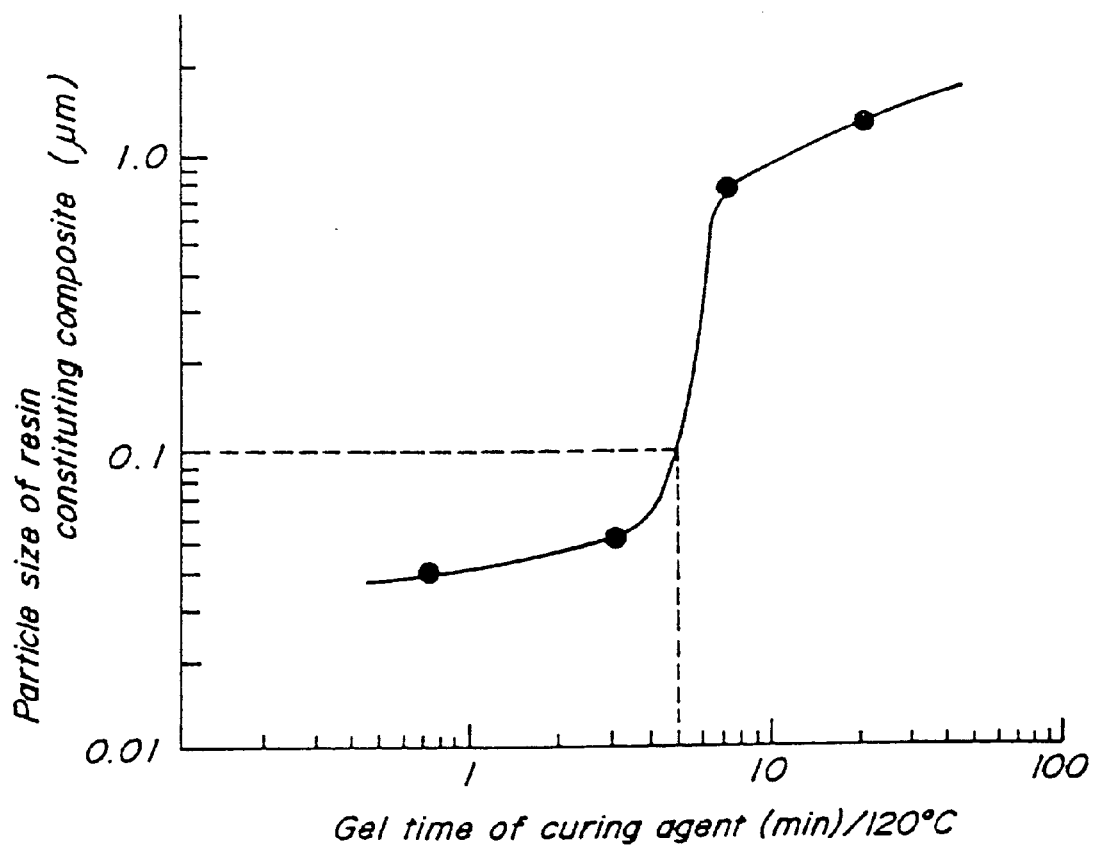
FIG_4

FIG_5 (a)
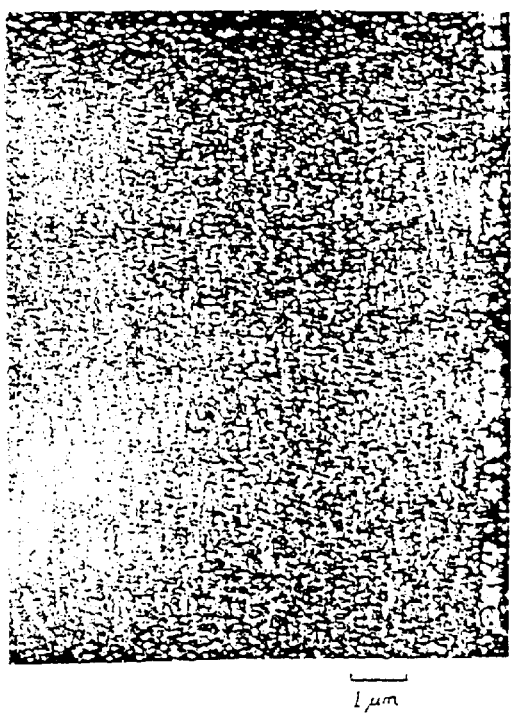
1 μm
FIG_5 (b)
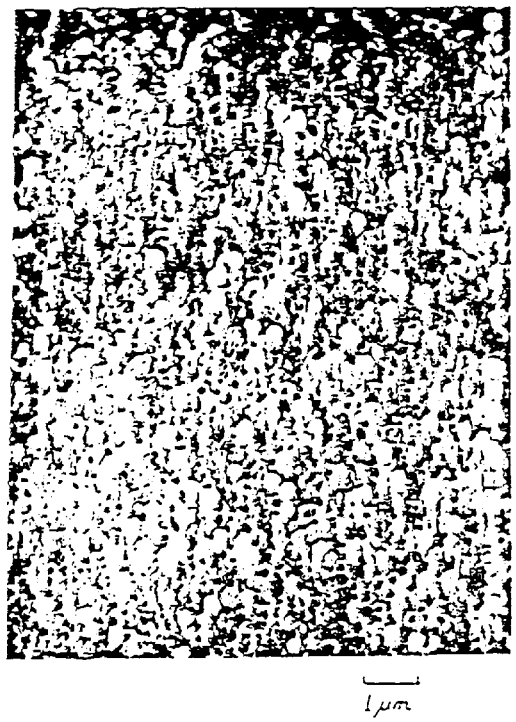
1 μm
FIG_5 (c)
1 μm
FIG_5 (d)
1 μm 1 μm 1 μm 1 μm 1 μm FIG_7
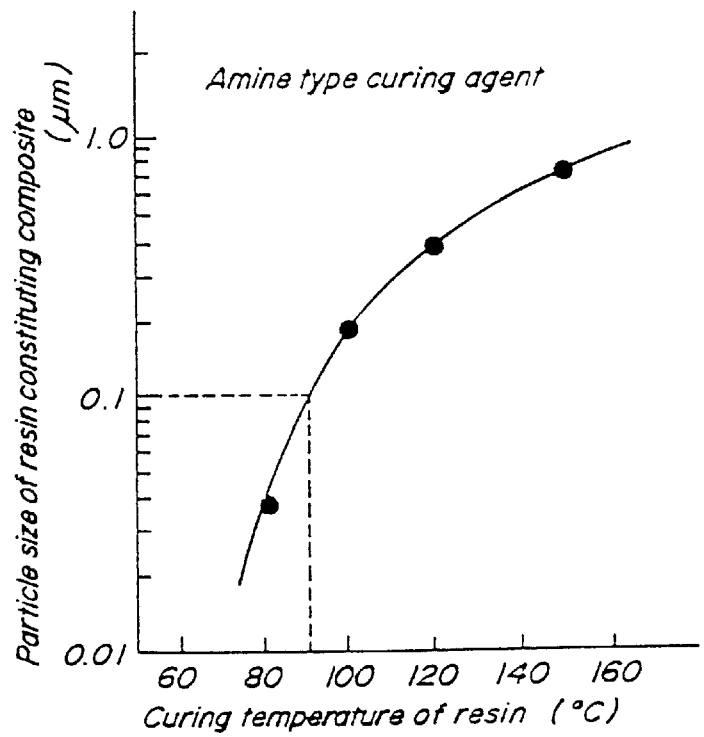
FIG_8
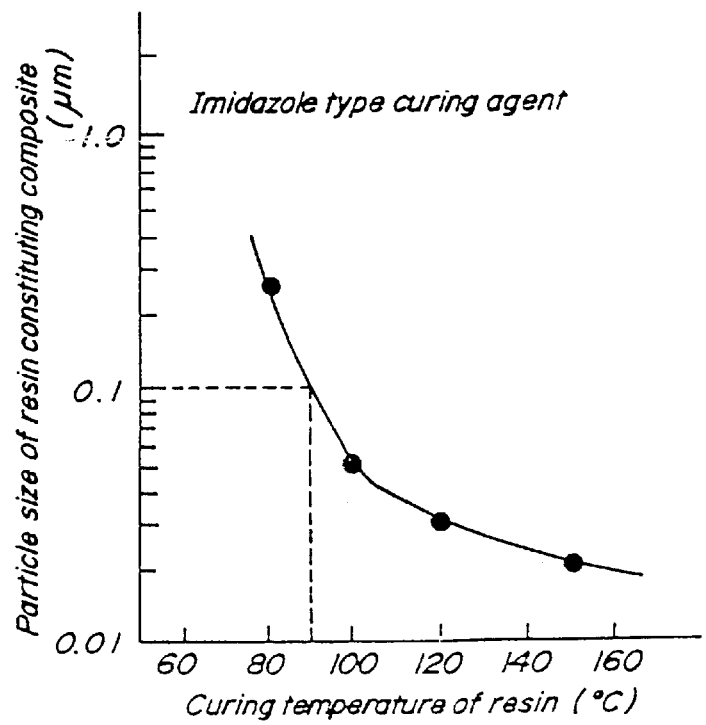

1 μm

1 μm

1 μm

1 μm

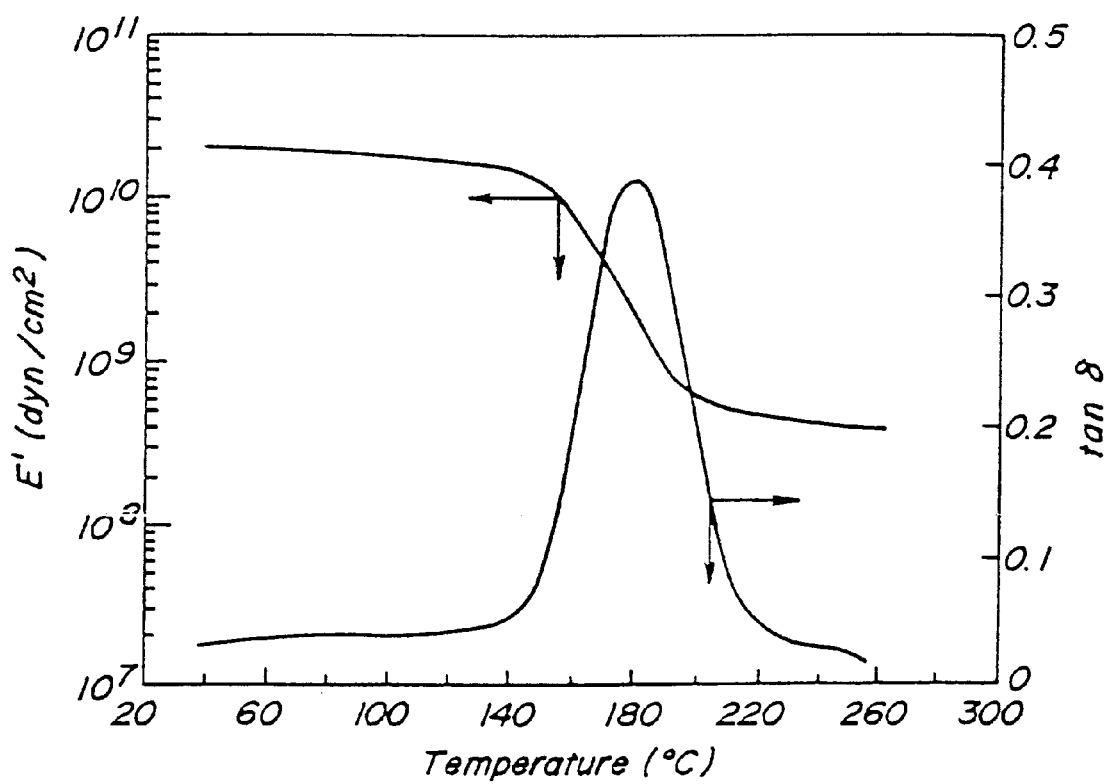
FIG_10

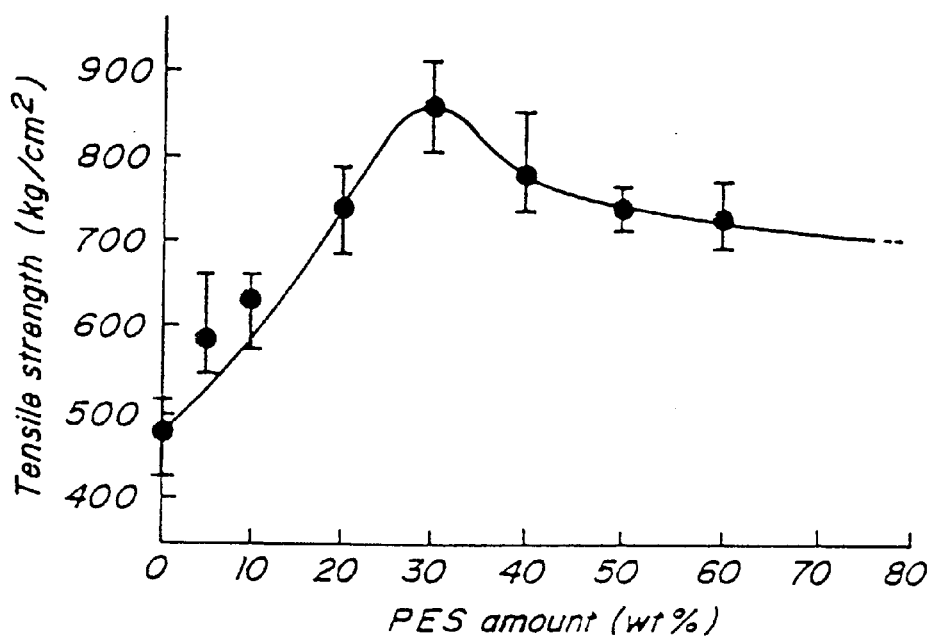
FIG_11a
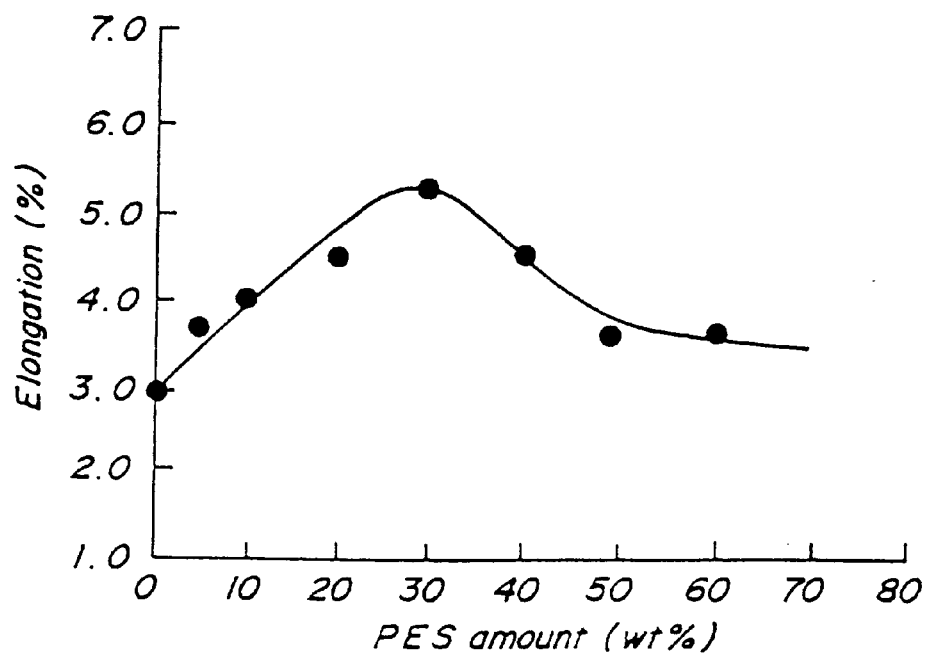
FIG_11b

RESIN COMPOSITES AND METHOD FOR PRODUCING THE SAME

CROSS REFERENCE TO RELATED APPLICATIONS

This application is a divisional of application No. 09/258,199, filed Feb. 26, 1999, now is U.S. Pat. No. 6,124,408, which is a continuation of application No. 08/941,397, filed Sep. 30, 1997, now U.S. Pat. No. 5,994,480, which is a continuation of application No. 08/594,371, filed Jan. 30, 1996, now abandoned, which is a continuation of application No. 08/200,522, filed Feb. 23, 1994, now abandoned. The entire disclosure of each of these applications is considered as being part of the disclosure of this application, and the entire disclosure of each of these applications is expressly incorporated by reference herein in its entirety.

BACKGROUND OF THE INVENTION

1. Field of the Invention

This invention relates to a novel resin composite consisting of a thermosetting resin and a thermoplastic resin or a photosensitive resin and a thermoplastic resin, and more particularly to a resin composite consisting of an epoxy resin and polyethersulphone (hereinafter abbreviated as PES) or a so-called PES modified epoxy resin, or a resin composite of an acrylic resin and polyether sulphone or a so-called PES modified acrylic resin as well as a method of producing the same.

2. Description of the Related Art

As the technique for the resin composite, there is a typical technique of improving the properties of a thermosetting resin by mixing the thermosetting resin with a thermoplastic resin. For example, in the mixed system (PES modified epoxy resin) of epoxy resin and polyethersulphone (PES), the toughness of the epoxy resin is improved by a co-continuous two-phase structure formed between the epoxy resin and PES (Keizo Yamanka and Takashi Inoue, Polymer, Vol. 30, p 662 (1989)).

In the above PES modified epoxy resin formed by mixing two resins, the toughness is improved as compared with that of the epoxy resin alone because the PES modified epoxy resin has a resin structure as mentioned below. That is, in the mixed system of PES and epoxy resin such as bisphenol A-type epoxy resin, when it is cured at a high temperature, a state of completely dissolving the epoxy resin and PES (compatible state) is not formed but a state of separately mixing the thermosetting resin and the thermoplastic resin through spinodal decomposition (phase separating state) is formed. The latter case is apparently a state of connecting spherical epoxy domains to each other and regularly dispersing them into the matrix of PES, which is a so-called co-continuous two-phase structure between the epoxy resin and PES.

The co-continuous two-phase structure is formed by the phase separating state between the epoxy resin and PES, and is a structure of merely dispersing the spherical epoxy domains produced by spinodal decomposition into the PES matrix. Therefore, the effect of dispersing PES into the epoxy resin is developed, but the properties of PES itself can not be enhanced. Because, when a glass transition temperature of the composite having the co-continuous two-phase structure is measured by the measurement of dynamic viscoelasticity, two values of glass transition temperature peak are observed and hence it is considered that the interaction of the epoxy resin and PES as a matrix is weak.

The above knowledge on the co-continuous two-phase structure is true in case of a mixed system of a photosensitive resin and a thermoplastic resin, e.g. a mixed system of acrylic resin and polyethersulphone (PES modified acrylic resin).

SUMMARY OF THE INVENTION

It is, therefore, an object of the invention to provide a novel resin composite having properties inherent to the thermosetting resin such as epoxy resin or a photosensitive resin such as acrylic resin, for example, heat resistance and photosensitivity and exhibiting properties higher than those inherent to a thermoplastic resin such as PES or the like as well as a method of producing the same.

The inventors have first made studies with respect to a mixed system of a thermosetting resin and a thermoplastic resin as a resin composite in order to achieve the above object.

In the mixed system of thermosetting resin and thermoplastic resin such as an epoxy resin/PES mixed system, the epoxy resin and PES exhibit a so-called LCST (Low Critical Solution Temperature) type phase diagram in which both are miscible with each other at a low temperature but separate into two phases at a high temperature as shown in FIG. 1. However, when the epoxy resin is highly polymerized through the curing reaction and the glass transition temperature (Tg) of the resin raised above the curing temperature, molecular motion is fixed at this temperature and the phase separation can not be caused. Because, the phase separation is required to take molecular motion and diffusion.

The invention has been accomplished as a result of the above studies noticing the above facts. That is, the above object can be attained by controlling phase separation rate and curing rate of thermosetting resin and thermoplastic resin and compositing these resins so as not to form clear co-continuous two-phase spherical domains due to the phase separation between both the resins.

That is, a first aspect of the invention lies in a resin composite consisting of a thermosetting resin and a thermoplastic resin, or of a thermosetting resin, a thermoplastic resin and a resin having a photosensitivity, characterized in that the thermosetting resin and thermoplastic resin form a quasi-homogeneous compatible structure. In this case, the particle size of the resin particles constituting the quasi-homogeneous compatible structure is not more than 0.1 $\mu$m as measured by means of a transmission type electron microscope (hereinafter abbreviated as TEM) and the peak value of the glass transition temperature of the resin as measured by dynamic viscoelasticity is one.

Moreover, the conditions for the measurement of dynamic viscoelasticity according to the invention are a vibration frequency of 6.28 rad/sec and a temperature rising rate of 5° C./min.

On the other hand, the inventors have made studies with respect to the system of a photosensitive resin and a thermoplastic resin as another resin composite in order to attain the above object. As a result, it has been found that the photosensitive resin and the thermoplastic resin are cured and composited by controlling the phase separation rate and the curing rate so as to not to form a clear co-continuous spherical domain structure to the phase separation between these resins likewise the mixed system of thermosetting resin and thermoplastic resin, and as a result the invention has been accomplished.

That is, a second aspect of the invention lies in a resin composite consisting of a photosensitive resin and a thermoplastic resin, characterized in that the photosensitive resin and thermoplastic resin form a quasi-homogeneous compatible structure. In this case, the particle size of the resin particles constituting the quasi-homogeneous compatible structure is not more than 0.1 µm as measured by means of TEM and the peak value of the glass transition temperature of the resin as measured by dynamic viscoelasticity is one.

The conditions for the measurement of dynamic viscoelasticity in the invention are a vibration frequency of 6.28 rad/sec and a temperature rising rate of 5° C./min.

According to a third aspect of the invention, there is the provision of a method of producing a resin composite by curing a thermosetting resin or a photosensitive resin mixed with a thermoplastic resin, which comprises curing the thermosetting resin and the thermoplastic resin at a curing rate exceeding a quasi-homogeneous phase forming point determined by at least one factor selected from a curing temperature of the thermosetting temperature, kind of a curing agent and presence or absence of photosensitivity, or curing the photosensitive resin and the thermoplatic resin at a curing rate exceeding a quasi-homogeneous phase forming point determined by a photocuring factor of the photosensitive resin.

According to a fourth aspect of the invention, there is the provision of a method of producing a resin composite by curing a thermosetting resin or a photosensitive resin mixed with a thermoplastic resin, which comprises curing these resins at a phase separation rate not exceeding a quasi-homogeneous forming point determined by at least one factor of crosslinking density and molecular weight of uncured thermosetting resin or uncured photosensitive resin.

According to a fifth aspect of the invention, there is the provision of a method of producing a resin composite by curing a thermosetting resin or a photosensitive resin mixed with a thermoplastic resin, which comprises curing these resins at a curing rate exceeding the quasi-homogeneous forming point and a phase separation rate not exceeding the quasi-homogeneous forming point.

In these methods, it is desirable that the compounding ratio of the thermosetting resin or photosensitive resin to the thermoplastic resin is 15–50 wt % as a content of thermoplatic resin.

BRIEF DESCRIPTION OF THE DRAWINGS

FIG. 4 is a graph showing a relationship between gel time of curing agent and particle size of resin constituting composite;

FIGS. 5a–5d are SEM photographs showing structures of cured resins obtained by using various curing temperatures, (a) 80° C., (b) 100° C., (c) 120° C. and (d) 150° C. in amine type curing agent, respectively;

FIG. 7 is a graph showing a relationship between curing temperature of resin and particle size of resin constituting composite (in case of amine type curing agent);

FIG. 8 is a graph showing a relationship between curing temperature of resin and particle size of resin constituting composite (in case of imidazole type curing agent);

FIG. 10 is a graph showing results measured on dynamic viscoelasticity of the resin composite according to the invention; and FIGS. 11a and 11b are graphs showing results measured on tensile strength and elongation under tension of the resin composite according to the invention.

DESCRIPTION OF PREFERRED EMBODIMENTS

The resin composite comprised of thermosetting resin or photosensitive resin and thermoplastic resin according to the invention lies in a feature that the thermosetting resin or photosensitive resin forms a quasi-homogeneous compatible structure with the thermoplastic resin.

The term "quasi-homogeneous compatible structure" used herein is a new concept devised by the inventors and means a structure mentioned below.

That is, the quasi-homogeneous compatible structure is a more homogeneous structure not only possessing properties inherent to the thermosetting resin such as epoxy resin or properties inherent to the photosensitive resin such as acrylic resin but also exhibiting a value higher than the property inherent to the thermoplastic resin such as PES, in which there is one peak value of the glass transition temperature as measured on dynamic viscoelasticity and the interaction between the thermosetting resin or photosensitive resin and the thermoplastic resin is very strong.

Figure 1:
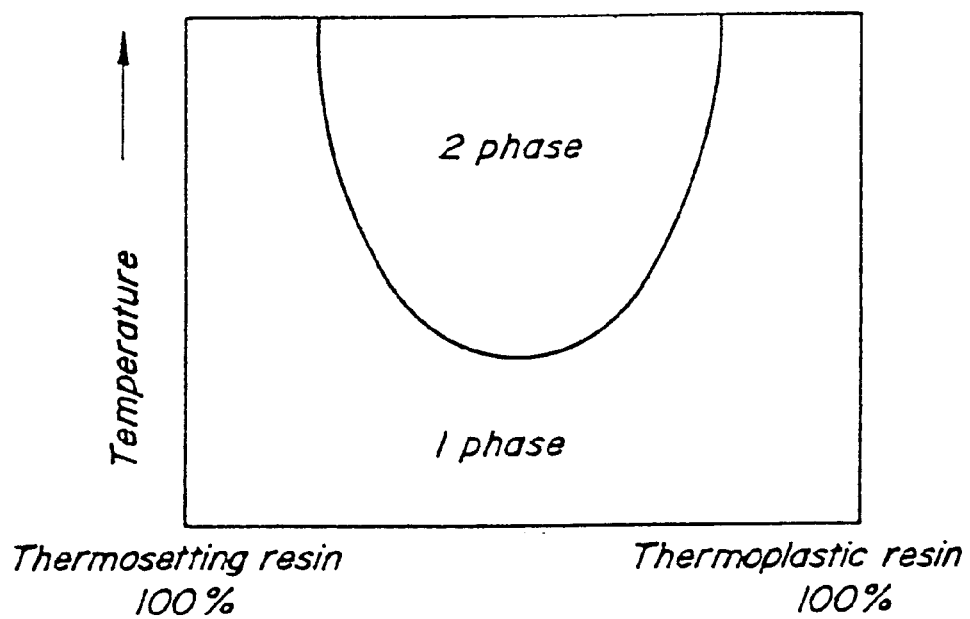
FIG. 1 is a phase diagram showing a mixed system of thermoplastic resin and thermosetting resin.
Figure 2:
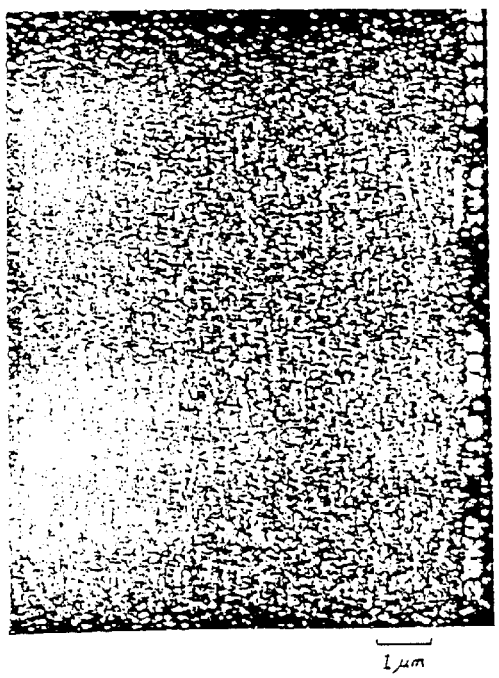
FIG. 2a is an SEM photograph showing a quasi-homogeneous compatible structure of the resin composite according to the invention.
FIG. 2b is an SEM photograph showing a co-continuous two-phase structure in the conventional resin composite.
FIG. 2c is an TEM photograph showing a quasi-homogeneous compatible structure of the resin composite according to the invention.
Figure 2:
Figure 2:

Thus, the resin composite according to the invention has a structure as shown by a photograph of a scanning electron microscope (hereinafter abbreviated by SEM) in FIG. 2a, which is clearly different from the conventional co-continuous two-phase structure shown by SEM photograph in FIG. 2b. Furthermore, the resin composite according to the invention becomes more homogeneous because the particle size of the resin particle constituting the composite as measured by TEM observation in FIG. 2c is not more than 0.1 µm.

The effect by such a structure of the resin composite is particularly conspicuous when the amount of the thermoplastic resin in the composite is 15–50 wt % as a solid content. When the amount of the thermoplastic resin is less than 15 wt %, the molecular of the thermoplastic resin entangling with a net of the resin component is less and the effect of increasing the toughness is not sufficiently developed, while when the amount of the thermoplastic resin exceeds 50 wt %, the interaction between the thermosetting resin or photosensitive resin and the thermoplastic resin becomes small due to the decrease of the crosslinking point.

The quasi-homogeneous compatible structure between the thermosetting resin or photosensitive resin and the thermoplastic resin is formed by the method according to the invention as mentioned below.

That is, the quasi-homogeneous compatible structure according to the invention is formed by uniformly mixing the thermosetting resin or photosensitive resin with the thermoplastic resin after dissolution in a solvent, if necessary, and then making the curing rate fast and/or making the phase separation rate slow to render the particle size of the resin particles constituting the composite into not more than 0.1 $\mu$m as a value measured by TEM observation.

Concretely, in the first method according to the invention, the curing is carried out at a cutting rate exceeding a quasi-homogeneous phase forming point determined by at least one factor selected from curing temperature of thermosetting resin, kind of curing agent and presence or absence of photosensitivity in case of using the thermosetting resin, or at a curing rate exceeding a quasi-homogeneous phase forming point determined by photocuring factors of photosensitive resin such as initiator, sensitizer, photosensitive monomer, exposure conditions and the like in case of using the photosensitive resin. The term "quasi-homogeneous phase forming point" used herein means a lower limit of the curing rate capable of obtaining such a quasi-homogeneous compatible structure that the particle size of the resin particle constituting the composite is not more than 0.1 $\mu$m as a value measured by TEM observation.

In the second method according to the invention, the curing is carried out at a phase separation rate not exceeding a quasi-homogeneous phase forming point determined by at least one of crosslinking density and molecular weight of the uncured thermosetting resin or uncured photosensitive resin. In this case, the term "quasi-homogeneous phase forming point" means an upper limit of the phase separation rate capable of obtaining such a quasi-homogeneous compatible structure that the particle size of the resin particle constituting the composite is not more than 0.1 $\mu$m as a value measured by TEM observation.

In the third method according to the invention, the curing is carried out at a curing rate exceeding the quasi-homogeneous phase forming point end at a phase separation rate not exceeding the quasi-homogeneous phase forming point. This means the case that the factors determining the curing rate and the phase separation rate influence with each other.

Then, the interrelation among the above factors determining the curing rate and the phase separation rate with a described. At first, the factor determining the curing rate is as follows when the other factors are constant:

(1) The curing rate becomes faster as the curing temperature of the thermosetting resin is high.

That is, when the thermosetting resin is cured so as to exceed the lower limit of the curing temperature required for the provision of the curing rate exceeding the quasi-homogeneous phase forming point, the structure of the resulting resin composite is a quasi-homogeneous compatible structure.

(2) The curing rate becomes faster as the gel time is short.

That is, when the thermosetting resin is cured by using a curing agent so as to not to exceed the upper limit of the gel time required for the provision of the curing rate exceeding the quasi-homogeneous phase forming point, the structure of the resulting resin composite is a quasi-homogeneous compatible structure.

(3) The curing rate becomes faster as the photosensitivity is imparted.

That is, when the photosensitivity is imparted to the resin in the combination of other factors forming the quasi-homogeneous compatible structure, the resulting resin composite is a more quasi-homogeneous compatible structure.

As a method of imparting the photosensitivity, there are a method of introducing a photosensitive group into the thermosetting resin or the thermoplastic resin and a method of compounding a photosensitive monomer, in which a photoinitiator and photosensitizer may be added, if necessary.

Moreover, a photosensitive resin such as acrylic resin or the like can be used instead of the thermosetting resin. In this case, it is necessary that the photosensitive resin should be cured at a curing rate exceeding the quasi-homogeneous phase forming point determined by photocuring factors such as initiator, sensitizer, photosensitive monomer, exposure conditions and the like.

Considering the above facts, when the variable factor in the compositing between the thermosetting resin or photosensitive resin and the thermoplastic resin is one, the value of the factor corresponding to the quasi-homogeneous phase forming point is one point. If the factors are two or more, the value of the factor corresponding to the quasi-homogeneous phase forming point is considered to be various combinations. That is, the combination for the curing rate can be selected so as to satisfy that the particle size of the resin constituting the composite is not more than 0.1 $\mu$m as measured by TEM observation.

Next, the factor determining the phase separation rate is as follows when the other factors are constant:

(1) It is difficult to produce the phase separation as the crosslinking density of the uncured thermosetting resin or uncured photosensitive resin becomes high (the phase separation rate becomes slow).

Therefore, when the curing is carried out by using the uncured thermosetting resin or uncured photosensitive resin with a crosslinking density exceeding the lower limit of the crosslinking density required for the provision of the phase separation rate not exceeding the quasi-homogeneous phase forming point, the resulting resin composite has a quasi-homogeneous compatible structure.

(2) It is difficult to produce the phase separation as the molecular weight of the uncured thermosetting resin or uncured photosensitive resin becomes large (the phase separation rate becomes slow).

Therefore, when the curing is carried out by using the uncured thermosetting resin or uncured photosensitive resin with a molecular weight exceeding the lower limit of the molecular weight required for the provision of the phase separation rate not exceeding the quasi-homogeneous phase forming point, the resulting resin composite has a quasi-homogeneous compatible structure.

Considering the above facts, when the variable factor in the composition between the thermosetting resin or photosensitive resin and the thermoplastic resin is one, the value of the factor corresponding to the quasi-homogeneous phase forming point is one point. If the factors are two or more, the value of the factor corresponding to the quasi-homogeneous phase forming point is considered to be various combinations. That is, the combination for the phase separation rate can be selected so as to satisfy that the particle size of the resin constituting the composite is not more than 0.1 $\mu$m as measured by TEM observation.

The resin composites obtained by the aforementioned methods according to the invention possess the properties inherent to the thermosetting resin such as epoxy resin or the properties inherent to the photosensitive resin such as acrylic resin and can exhibit the value of properties higher than those inherent to the thermoplastic resin such as PES. That is, PES-modified epoxy resin and PES-modified acrylic resin according to the invention is high in the resin strength as compared with that of PES alone and have an effect of strengthening the epoxy resin or acrylic resin, which have never been attained in the conventional technique.

According to the invention, the thermosetting resin or photosensitive resin and the thermoplastic resin are dissolved in a solvent, if necessary, and then uniformly mixed before the compositing between the thermosetting resin or photosensitive resin and the thermoplastic resin as mentioned above. As the solvent, use may be made of dimethylformamide (DMF), methylene chloride, dimethylsulphoxide (DMSO), normal methylpyrrolidone (NMP) and the like.

Furthermore, it is possible to mix the thermosetting resin or photosensitive resin and the thermoplastic resin by fusing through heating at a temperature lower than the initiating temperature of phase separation and lower than the cure initiating temperature.

As the thermosetting resin used in the invention, mention may be made of phenolic resin, amino resin such as melamine resin and urea resin, epoxy resin, phenoxy resin, epoxy-modified polyimide resin, unsaturated polyester resin, polyimide resin, urethane resin, diallylphothalate resin and the like. Further, a part of the functional groups contributing to the thermosetting in the thermosetting resin may locally be substituted with a photosensitive group. For example, 20–50% acrylated epoxy resin is preferable.

As the thermoplastic resin used in the invention, mention may be made of polyether sulphone, polysulphone, polyether imide, polystyrene, polyethylene, polyarylate, polyamidoimide, polyphenylene sulfide, polyether ether ketone, polyoxybenzoate, polyvinyl chloride, polyvinyl acetate, polyacetal, polycarbonate and the like.

As the photosensitive resin used in the invention, acrylic resins such as methyl polymethacrylate and the like or 100% acrylated product of thermosetting resin such as acrylated phenolic resin, acrylated amino resin, acrylated epoxy resin, acrylated phenoxy resin, acrylated epoxy-modified polyimide resin, acrylated unsaturated polyester resin, acrylated polyimide resin, acrylated urethane resin, and acrylated diallylphthalate resin, are preferable.

As the photoinitiator being important as a photocuring factor of the photosensitive resin, use may preferably be made of at least one compound selected from intramolecular photocleavage type compounds such as benzoisobutyl ether, benzyldimethyl ketal, diethoxyacetophenone, acyloxim ester, chlorinated acetophenone, hydroxyacetophenone and the like and intramolecular hydrogen abstraction type compounds such as benzophenone, Michlers ketone, dibenzosuberone, 2-ethylanthraquinone, isobutylthioxane and the like. As a photoinitiating assistant, use may be made of at least one of triethanol amine, Michlars ketone, 4,4-diethylaminobenzophenone, 2-dimethylaminoethyl benzoate, ethyl 4-dimethylaminobenzoate, (n-butoxy)ethyl 4-dimethylaminobenzoate, isoamyl 4-dimethylaminobenzoate, 2-ethylhexyl 4-dimethylaminobenzoate, polymerizable tertiary amine and the like. As a photosensitizer, Michlars ketone, Irgaqua 651, isoproylthioxanthone and the like are preferable. Some of the above initiators act as a photosensitizer. Moreover, a composition ratio of the photoinitiator and the photosensitizer based on 100 parts by weight of the photosensitive resin is preferable as follows.

benzophenone/Michlars ketone=5 parts by weight/0.5 part by weight

Irgaqua 184/Irgaqua 651=5 parts by weight/0.5 part by weight

Irgaqua 907/isopropylthioxanthone=5 parts by weight/0.5 part by weight

As a photosensitive monomer or photosensitive oligomer constituting the photosensitive resin, epoxy acrylate, epoxy methacrylate, urethane acrylate, polyester acrylate, polystyryl methacrylate and the like are favorably used.

According to the invention, when the epoxy resin is sued as the thermosetting resin, imidazole type curing agent, diamine, polyamide, polyamide, anhydrous organic acid, vinylphenol or the like can be used as a curing agent. On the other hand, when using the thermosetting resin other than the epoxy resin, well-known curing agents may be used.

The resin composites according to the invention possessing the properties inherent to the thermosetting resin such as epoxy resin or the properties inherent to the photosensitive resin such as acrylic resin and exhibiting the value of properties higher than those of the thermoplastic resin such as PES to be composited are expected to be utilized to various applications such as electroless plating adhesive for printed circuit board, base material for printed circuit board, resist material, prepreg material, sealing material for semiconductor package, matrix for fiber reinforced composite material, injection molding material, compression molding material and so on.

The following examples are given in illustration of the invention and are not intended as limitations thereof.

EXAMPLE 1

Influence of curing agent (1) In epoxy resin/PES system, It is examined how to influence the kind of the curing agent for epoxy resin upon the resin structure and properties of the above system when using various curing agents having different gel times.

(2) As the curing agents having different gel times, several imidazole type curing agents (made by Shikoku Kasei K. K.) as shown in Table 1 are used.

(3) In order to examine the influence of the curing agent, bisphenol A-type epoxy resin (made by Yuka Shell Co., Ltd. trade name: Epikote 828) is used as the epoxy resin and mixed with PES at a compounding ratio of epoxy resin/PES of 70/30 after PES is dissolved in 2 times of dimethylformamide (DMF) and then a given amount of the epoxy resin is mixed with a curing agent and cured. Moreover, the epoxy equivalent of the epoxy resin is 184–194 and the curing conditions are 120° C.,×5 hours+150° C.×2 hours.

Figure 3:
FIG. 3a–3d are SEM photographs showing structures of cured resins obtained by using various imidazole type curing agents, (a) 2PHZ-CH (b) 2PZ-OK, (c) 2E4MZ-CN and (d) 182Mz, respectively.
Figure 3:
Figure 3:
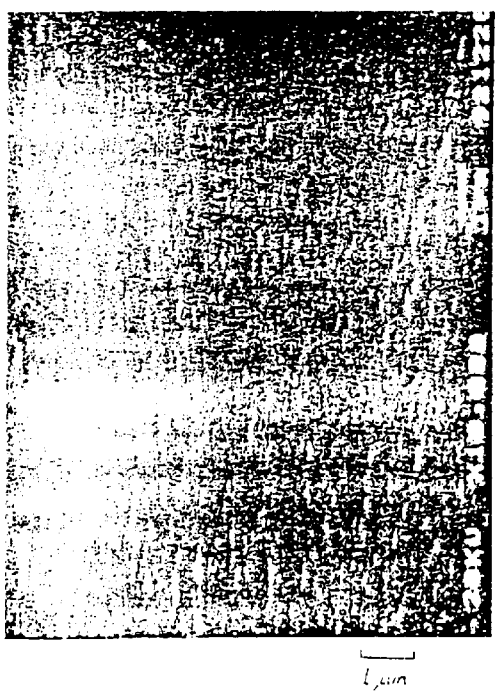
Figure 3:
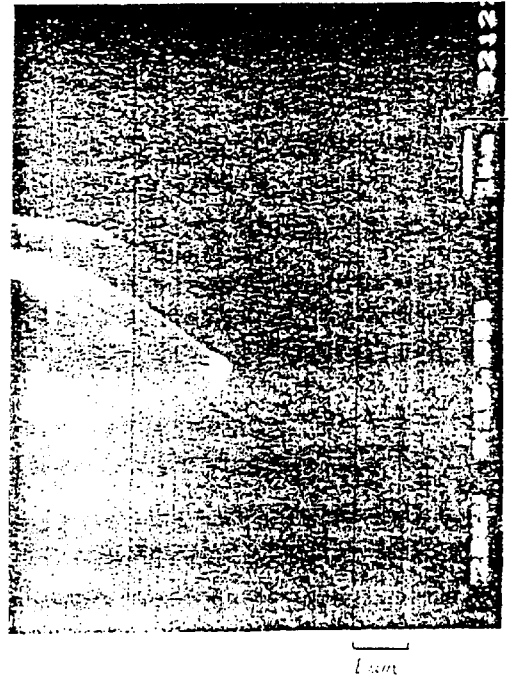

The structure and properties of the resulting cured resin composite are measured to obtain results shown in FIG. 3 and Table 1. FIGS. 3a–3d are SEM photographs showing the structures of the cured resin composites using the imidazole type curing agents shown in Table 1, respectively, in which the curing agent is 2PHZ-CN in FIG. 3a, 2PZ-OK in FIG. 3b, 3E4MZ-CN in FIG. 3c, and 182Mz in FIG. 3d. As seen from Table 1 and the photographs, when using the curing agent having a slow curing time, spherical domain structure is formed with the progress of phase separation and hence the strength and elongation of the resin composition are low. On the other hand, when the curing is carried out with the curing agent showing a curing rate exceeding the quasi-homogeneous phase forming point, the epoxy resin and PES form the quasi-homogeneous compatible structure and the strength and elongation of the cured product are largely improved.

FIG. 4 is a graph showing a relationship between the particle size of the resin in the cured resin composite through SEM observation and the gel time of the curing agent. As seen from the results of FIG. 4, when the gel time at 120° C. is not more than about 5 minutes, the particle size of the resin becomes rapidly small and the spherical domain structure is changed into the quasi-homogeneous compatible structure. That is, it is understood that the quasi-homogeneous phase forming point determined by the gel time of the curing agent exists in a point that the gel time is about 5 minutes under the conditions of this example.

TABLE 1

| Curing agent | Gel Time (120° C.) | Resin Structure | Tensile strength (kg/cm$^2$) | Elongation (%) |
|---|---|---|---|---|
| 2PHZ-CN (10 phr) | 20 min | Spherical domain | 335 | 2.1 |
| 2PZ-OK (5 phr) | 7.0 min | Spherical domain | 450 | 4.2 |
| 2E4MZ-CN (5 phr) | 3.0 min | quasi-homogeneous compatible structure | 810 | 8.6 |
| 1B2MZ (4 phr) | 0.8 min | quasi-homogeneous compatible structure | 820 | 9.0 |

EXAMPLE 2

Influence of curing temperature (1) In epoxy resin/PES system, it is examined how to influence the curing temperature of the epoxy resin upon the resin structure of the resulting cured resin composite when the curing is carried out under conditions having different curing temperatures.

(2) The curing conditions of different curing temperature are as follows.
 a. 80° C. for 6 hours,
 b. 100° C. for 6 hours,
 c. 120° C. for 5 hours,
 d. 150° C. for 4 hours.

(3) It is confirmed that there are two cases, i.e. (i) the formation of quasi-homogeneous compatible structure as the curing temperature becomes low and (ii) the formation of quasi-homogeneous compatible structure as the curing temperature becomes high in accordance with the kind of the curing agent, from which (a) amine type curing agent (made by Sumitomo Chemicals, Industries, Co., trade name: DDM) and (b) imidazole type curing agent (made by Shikoku Kasei K.K. trade name: 2E4MZ-CN) are used.

(4) In order to examine the influence of the curing temperature, bisphenol A-type epoxy resin (made by Yuka Shell Co., Ltd. trade name: Epikote 828) is used as the epoxy resin and mixed with PES and the curing agent at a compounding ratio of epoxy resin/PES/curing agent if 70/30/20 in case of the amine type curing agent (DDM) and 70/30/5 in case of the imidazole type curing agent (2E4MZ-CN), after PES is dissolved in 2 times of dimethylformamide (DMF) and then a given amount of the epoxy resin is mixed with a curing agent and cured. Moreover, the epoxy equivalent of the epoxy resin is 184–194.

Figure 6:
FIGS. 6a–6d are SEM photographs showing structures of cured resins obtained by using various curing temperatures, (a) 80° C., (b) 100° C., (c) 120° C., and (d) 150° C. in imidazole type curing agent, respectively.
Figure 6:
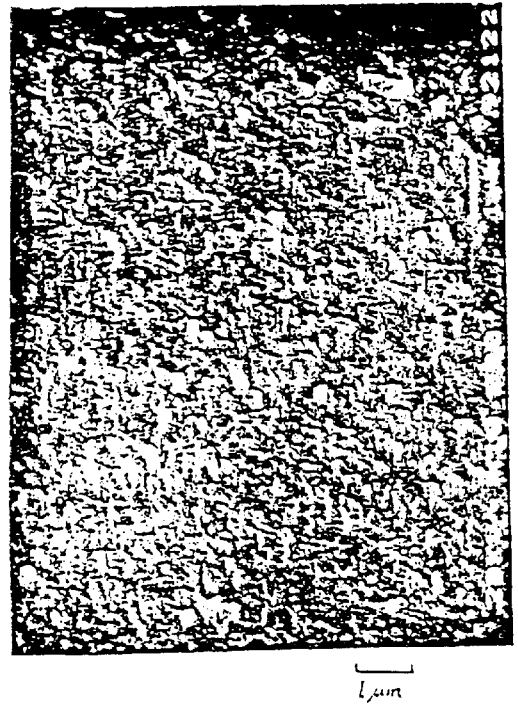
Figure 6:
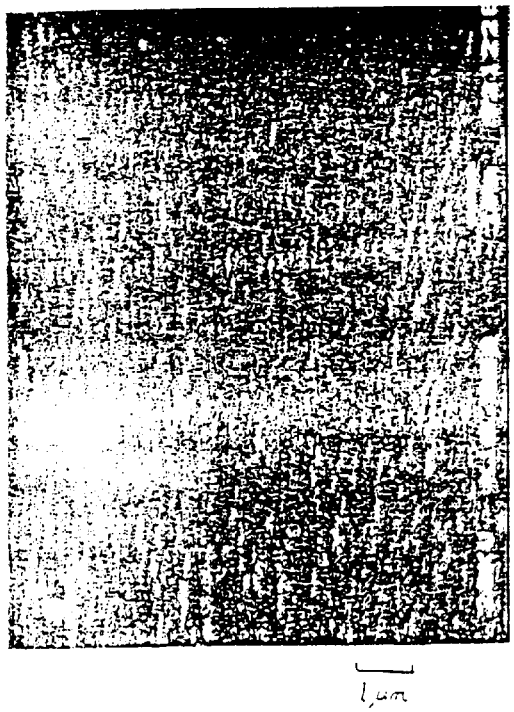
Figure 6:
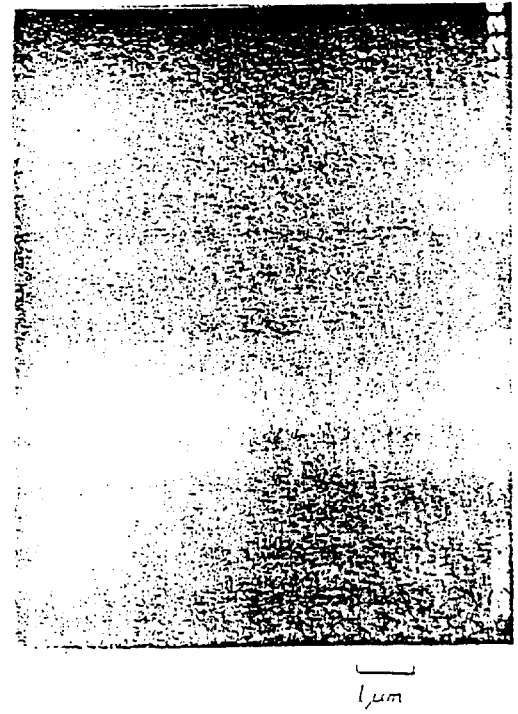

The structure of the resulting cured resin composite is measured to obtain results shown in FIGS. 5 and 6. FIGS. 5a–5d are concerned with (a) the amine type curing agent, while FIGS. 6a–6d are concerned with (b) the imidazole type curing agent. All of the structures are shown by SEM photographs at various curing temperatures of (a) 80° C., (b) 100° C., (c) 120° C. and (d) 150° C.

As seen from FIG. 5, when the amine type curing agent (DDM) is used as the curing agent, if the curing temperature is 80° C., the resin structure is the quasi-homogeneous compatible structure, while if the curing temperature is not lower than 100° C., the resin structure is the spherical domain structure and the particle size thereof is not less than 0.2 μm.

On the other hand, as seen from FIG. 6, when the imidazole type curing agent (2E4MZ-CH) is used as the curing agent, if the curing temperature is not lower than 100° C., the resin structure is the quasi-homogeneous compatible structure, while if the curing temperature is 80° C., the resin structure is the spherical domain structure having a particle size of about 0.3 μm.

FIGS. 7 and 8 show relationship between particle size of the resin through SEM observation and curing temperature of epoxy resin in two kinds of the curing agent, respectively. As seen from the results of these figures, when the curing temperature is not higher than 90° C., the structure is changed from the spherical domain structure into the quasi-homogeneous compatible structure in case of (a) amine type curing agent, while when the curing temperature is not lower than 90° C., the structure is changed from the spherical domain structure into the quasi-homogeneous compatible structure in case of (b) imidazole type curing agent. That is, the quasi-homogeneous phase forming point determined by the curing temperature of epoxy resin under the conditions of this example exists in a point that the curing temperature is about 90° C.

EXAMPLE 3

Influence of Crosslinking Density (1) In epoxy resin/PES system, it is examined how to influence the epoxy equivalent of the epoxy resin upon the resin structure of the resulting cured resin composite by curing epoxy resins having same skeleton structure and different epoxy equivalents, whereby the influence of the crosslinking density in the resin is considered.

(2) As the epoxy resin having a different epoxy equivalent, several bisphenol A-type epoxy resins shown in Table 2 are used.

(3) In order to examine the influence of epoxy equivalent, an imidazole type curing agent (made by Shikoku Kasei K.K. trade name: 2E4MZ-CN) is used as the curing agent, and PES is dissolved in 2 times of dimethylformamide (DMF) and mixed with a given amount of epoxy resin and the curing agent at a compounding ratio of epoxy resin/PES/curing agent at a compounding ratio of epoxy resin/PES/curing agent of 70/30/5 and cured. The curing conditions are 80° C. for 1 hour, 100° C. for 1 hour, 120° C. for 1 hour and 150° C. for 3 hours.

Figure 9:
FIGS. 9a–9d are SEM photographs showing structures of cured resins obtained by using various epoxy resins having different epoxy equivalents, (a) Epikote 828, (b) Epikota 1001, (c) Epikote 1004 and (d) Epikote 1007, respectively.
Figure 9:
Figure 9:
Figure 9:
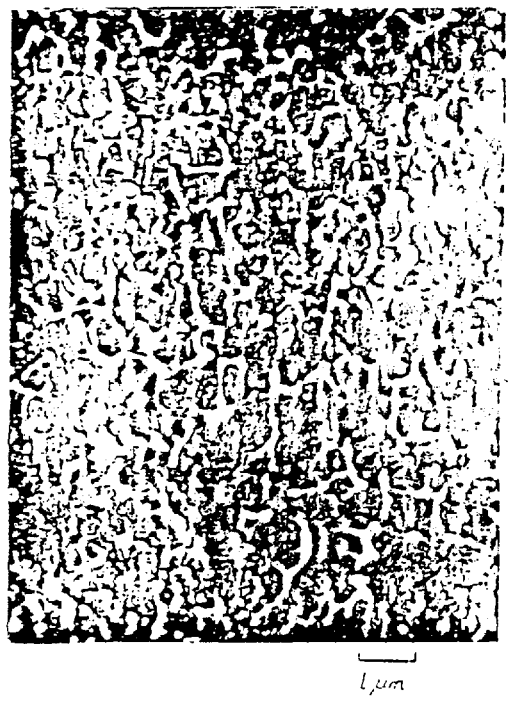

The structure of the resulting cured resin composite is measured to obtain results shown in FIG. 9 and Table 2. FIGS. 9a–9d are SEM photographs showing the structures of the cured resin composites obtained by using epoxy resins having various epoxy equivalents, respectively, in which the epoxy resin is Epikote 828 in FIG. 9a, Epikote 1001 in FIG. 9b , Epikote 1004 in FIG. 9c and Epikote 1007 in FIG. 9d. As seen from these photographs and Table 2, when the epoxy equivalent is large or the crosslinking density is low, phase separation is apt to be caused, while when the epoxy equivalent is small or the crosslinking density is high, the resin structure is the quasi-homogeneous compatible structure. That is, the quasi-homogeneous phase forming point determined by the epoxy equivalent (or crosslinking density) of the epoxy resin under the conditions of this example exists in a point that the epoxy equivalent is about 300.

TABLE 2

| Epoxy resin | Epoxy equivalent | Resin structure |
| --- | --- | --- |
| Epikote 828 | 184~194 | quasi-homogeneous compatibel structure |
| Epikote 1001 | 450~500 | spherical domain |
| Epikote 1004 | 875~975 | two phase separation |
| Epikote 1007 | 1750~2200 | two phase separation |

EXAMPLE 4

Influence of Photosensitive Monomer (1) In epoxy resin/PES system, it is examined how to influence the introduction of photosensitive monomer upon the resin structure and the properties of the resulting cured resin composite, whereby the influence of the provision of photosensitivity is considered.

(2) As the photosensitive monomer, dipentaerythritol hexaacrylate (trade name: DPE-6A, made by Kyoeisha Yushi K.K.) and neopentylglycol-modified trimethylol propane diacrylate (trade name: R-604, made by Nihon Kayaku K.K.) are used, and also benzophenone (BP, made by Kanto Kagaku K.K.) as a photoinitiator and Michlars ketone (MK, Kanto Kagaku K.K.) as an accelerator are used, and then the curing is carried out under the following conditions to obtain a cured resin composite.

[photocuring conditions]

3J/cm$^2$

[heat curing conditions]

80° C. for 1 hour, 100° C. for 1 hour, 120° C. for 1 hour, 150° C. for 3 hours.

(3) In order to examine the effect of introducing the photosensitive monomer, bisphenol A-type epoxy resin (made by Yuka Shell Co., Ltd. trade name: Epikote 828) is used as the epoxy resin and an imidazole type curing agent (made by Shikoku Kasei K.K. trade name Epikote 828) is used as the epoxy resin and an imidazole type curing agent (made by Shikoku Kasei K.K. trade name: 2E4MZ-CN) is used as the curing agent, and PES is dissolved in 2 times of dimethylformamide (DMF) and mixed with a given amount of epoxy resin and the curing agent at a compounding ratio of epoxy resin/PES of 70/30 and cured. Moreover, the epoxy equivalent of the epoxy resin is 184–194.

The structure and properties of the resulting cured resin composite are measured to obtain results as shown in Table 3.

As seen from Table 3, the epoxy resin and PES are cured by utilizing photoreaction at a lower temperature side at homogeneously compatible state thereof and further heat cured to form a quasi-homogeneous compatible structure having a smaller particle size, whereby the strength and elongation of the cured resin composite are more improved.

TABLE 3

| Resin composition | Curing condiitons | Resin structure | Tensile strength (kg/cm$^2$) | Elongation (%) |
| --- | --- | --- | --- | --- |
| epoxy resin/PES/ 2E4MZ-CN = 70/30/5 | heat curing | quasi-homogeneous compatible structure | 780 | 8.0 |
| epoxy resin/PES/ 2E4MZ-CN/DPE-6A/R-604/BP/MK = 70/30/5/7.5/ 3.75/5/0.5 | 1. photo-curing 2. heat curing | quasi-homogeneous compatible structure | 870 | 9.0 |

Then, the resulting cured resin composite is subjected to TEM observation under the following conditions. As a result, the particle size of the resin constituting the cured resin composite is not more than 0.1 μm.

[observation conditions]

(1) The sample is cut into a slice of 70 nm with a microtome.

(2) The cut slice is immersed in a solution of osmium tetraoxide (OsO$_4$) in methanol for 24 hours.

(3) The TEM observation is conducted at an acceleration voltage of 80 kV.

Furthermore, the glass transition temperature Tg is measured by dynamic visoelastic measurement. As a result, the peak number of Tg is 1 as shown in FIG. 10, which indicates that the cured resin composite is homogeneous in the properties. Thus, it is guessed that the properties such as tensile strength, elongation and the like are higher than those of the single resin component.

EXAMPLE 5

Influence of PES amount (1) In the epoxy resin/PES system, it is examined how to influence the amount of PES upon the properties of the resulting cured resin composite by varying the PES amount.

(2) The amount of PES is varied within a range of 0 wt % to 60 wt %.

(3) In order to examine the influence of PES amount, a cresol-novolac type epoxy resin (made by Nihon Kayaku K.K. trade name: EOCN-103S) is used as the epoxy resin and an imidazole type curing agent (made by Shikoku Kasei K.K. trade name: 2E4MZ-CN) is used as the curing agent, and PES is dissolved in 2 times of dimethylformamide (DMF) and mixed with given amounts of epoxy resin and curing agent and cured. Moreover, the epoxy equivalent of epoxy resin is 210–230, and the curing of the epoxy resin is carried out at 80° C. for 1 hour, 100° C. for 1 hours, 120° C. for 1 hour and 150° C. for 3 hours.

The change in the properties of the resulting cured resin composite is measured to obtain results shown in FIG. 11.

As seen from the results of FIG. 11, as the PES amount increases, the strength of the resin composite becomes larger and is maximum at 30% PES, while as the PES amount exceeds 30%, the resin strength becomes rather small. Particularly, the strength of the cured resin composite at 30% PES is higher than that of the epoxy resin alone or PES alone. Under the conditions of this example, all of the resulting cured resin composites form the quasi-homogeneous compatible structure.

In the epoxy resin/PES system, it is confirmed that the amount of PES is 15–50 wt %, preferably 20–40 wt %.

EXAMPLE 6

In epoxy resin/PES system, bisphenol A-type epoxy resin having an epoxy equivalent of 184–194 (made by Yuka Shell Co., Ltd. trade name: Epikote 828) is used as an epoxy resin and an imidazole type curing agent (made by Shikoku Kasei K.K. trade name: 2E4MZ-CN) is used as a curing agent and mixed in DMF according to the following compounding composition, which is cured at 120° C. for 5 hours and at 150° C. for 2 hours to obtain a cured resin composite having a quasi-homogeneous compatible structure. Moreover, a gel time of the curing agent at 120° C. is 3 minutes.

Composition: Epikote 828/PES/2E4MZ-CN=70/30/5

The resulting cured resin composite is subjected to TEM observation in the same manner as in Example 4, and consequently the particle size of the resin is not more than 0.1 $\mu$m.

Further, when the glass transition temperature Tg is measured by dynamic viscoelastic measurement, the peak number of Tg is 1 likewise Example 4.

Moreover, the tensile strength and elongation under tension of the cured resin composite are 835 kg/cm$^2$ and 8.0%, respectively, which are higher than those of the single resin component.

On the other hand, the tensile strength and elongation under tension of the cured product made of only the epoxy resin under the same curing conditions as mentioned above are about 500 kg/cm$^2$ and 4.8%, respectively.

The same results as mentioned above are obtained by using an imidazole type curing agent (made by Shikoku Kasei K.K. trade name: 1B2MZ) as a curing agent. In this case, the gel time of the curing agent at 120° C. is 44 seconds.

EXAMPLE 7

In epoxy resin/PES system, bisphenol A-type epoxy resin having an epoxy equivalent of 184–194 (made by Yuka Shell Co., Ltd. trade name: Epikote 828) is used as an epoxy resin and an imidazole type curing agent (made by Shikoku Kasei K.K. trade name: 2E4MZ-CN) is used as a curing agent and mixed in DMF according to the following compounding composition, which is cured at 80° C. for 1 hour at 150° C. for 4 hours to obtain a cured resin composite having a quasi-homogeneous compatible structure. Moreover, this example is different from Example 6 in the curing temperature of the epoxy resin.

Composition: Epikote 828/PES/2E4MZ-CN=70/30/5.

The resulting cured resin composite is subjected to TEM observation in the same manner as in Example 4, and consequently the particle size of the resin is not more than 0.1 $\mu$m.

Further, when the glass transition temperature Tg is measured by dynamic viscoelastic measurement, the peak number of Tg is 1 likewise Example 4.

Moreover, the tensile strength and elongation under tension of the cured resin composite are 835 kg/cm$^2$ and 9.1%, respectively, which are higher than those of the single resin component.

On the other hand, the tensile strength and elongation under tension of the cured product made of only the epoxy resin under the same curing conditions as mentioned above are about 500 kg/cm$^2$ and 4.5%, respectively.

EXAMPLE 8

In epoxy resin/PES system, bisphenol A-type epoxy resin having an epoxy equivalent of 184–194 (made by Yuka Shell Co., Ltd. trade name: Epikote 828) is used as an epoxy resin and an amine type curing agent (made by Sumitomo Kagaku K.K. trade name: DDM) is used as a curing agent and mixed in DMF according to the following compounding composition, which is cured at 80° C. for 6 hours and at 150° C. for 2 hours to obtain a cured resin composite having a quasi-homogeneous compatible structure.

Composition: Epikote 828/PES/DDM=70/30/18

The resulting cured resin composite is subjected to TEM observation in the same manner as in Example 4, and consequently the particle size of the resin is not more than 0.1 $\mu$m.

Further, when the glass transition temperature Tg is measured by dynamic viscoelastic measurement, the peak number of Tg is 1 likewise Example 4.

Moreover, the tensile strength and elongation under tension of the cured resin composite are 860 kg/cm$^2$ and 8.6%, respectively, which are higher than those of the single resin component.

On the other hand, the tensile strength and elongation under tension of the cured product made of only the epoxy resin under the same curing conditions as mentioned above are about 500 kg/cm$^2$ and 5%, respectively.

EXAMPLE 9

In epoxy resin/PES system, cresol-novolac type epoxy resin having an epoxy equivalent of 210–230 (made by Nihon Kayaku K.K. trade name: EOCN-103S) is used as an epoxy resin and an imidazole type curing agent (made by Shikoku Kasei K.K. trade name: 2E4MZ-CN) is used as a curing agent and mixed in DMF according to the following compounding composition, which is cured at 80° C. for 1 hour and at 150° C. for 4 hours to obtain a cured resin composite having a quasi-homogeneous compatible structure.

Composition: EOCN-103S/PES/2E4MZ-CN=70/30/5

The resulting cured resin composite is subjected to TEM observation in the same manner as in Example 4, and consequently the particle size of the resin is not more than 0.1 $\mu$m.

Further, when the glass transition temperature Tg is measured by dynamic viscoelastic measurement, the peak number of Tg is 1 likewise Example 4.

Moreover, the tensile strength and elongation under tension of the cured resin composite are 990 kg/cm$^2$ and 6.5%, respectively, which are higher than those of the single resin component.

On the other hand, the tensile strength and elongation under tension of the cured product made of only the epoxy resin under the same curing conditions as mentioned above are about 500 kg/cm$^2$ and 2.8%, respectively.

EXAMPLE 10

Application to adhesive for additive circuit board (1) Seventy parts by weight of cresol-novolac type epoxy resin (made by Nihon Kayaku K.K.), 30 parts by weight of polyether sulphone (PES, made by ICI), 5 parts by weight of an imidazole type curing agent (made by Shikoku Kasei K.K. trade name: 2E4MZ-CN), 25 parts by weight of fine powder of epoxy resin (made by Toray Co., Ltd.) having an average particle size of 5.5 $\mu$m and 10 parts by weight of the same fine powder having an average particle size of 0.5 $\mu$m are mixed and adjusted to a viscosity of 120 cps in a homodisper agitating machine while adding a mixed solvent of dimethylformamide/butylcellosolve (1/1) and then kneaded through three rolls to obtain an adhesive solution.

(2) The adhesive solution is applied onto a glass-epoxy insulating plate (made by Toshiba Chemical K.K.) not provided with a copper foil by means of a roller coater and then cured at 80° C. for 1 hour, 100° C. for 1 hour, 120° C. for 1 hour and 150° C. for 3 hours to form an adhesive layer having a thickness of 20 μm.

(3) The substrate having the adhesive layer is immersed in an aqueous solution of chromic acid ($CrO_3$, 500 g/l) at 70° C. for 15 minutes to roughen the surface of the adhesive layer, immersed in a neutral solution (made by Shipley) and then washed with water.

(4) A palladium catalyst (made by Shipley) is applied onto the roughened surface of the adhesive layer of the substrate to activate the surface of the adhesive layer, which is immersed in an electroless plating solution for additive having a composition as shown in Table 4 for 11 hours to form an electroless copper plated layer having a thickness of 25 μm.

TABLE 4

| | |
|---|---|
| Coppur sulfate ($CuSO_4$-$5H_2O$) | 0.06 mol/l |
| Formalin | 0.30 mol/l |
| Caustic soda | 0.35 mol/l |
| EDTA | 0.12 mol/l |
| Additive | slight |
| Temperature of plating solution | 70° C. |
| pH of plating solution | 12.4 |

COMPARATIVE EXAMPLE 1

Application to adhesive for additive circuit board

An adhesive solution containing fine powder of epoxy resin is prepared and then an adhesive layer having a thickness of 20 μm and an electroless copper plated layer having a thickness of 25 μm are formed on a glass epoxy insulating plate (made by Toshiba Chemical Co., Ltd.) in the same manner as in Example 10 except for the following conditions.

[Resin composition]
  phenol-novolac type epoxy resin: 100 parts by weight
  Imidazole type curing agent (made by Shikoku Kasei K.K. trade name: 2P4MHZ): 4 parts by weight
[Curing condition of adhesive layer]
  100° C. for 1 hour, 150° C. for 5 hours The peel strength of the electroless copper plated layer and the insulation resistance and glass transition temperature Tg of the adhesive layer in Example 10 and Comparative Example 1 are measured to obtain results as shown in Table 5.

As seen from the results of Table 5, when the PES modified epoxy resin having the quasi-homogeneous compatible structure according to the invention is used as an adhesive for printed circuit board, the adhesion strength, heat resistance and electrical resistance are considerably improved as compared with those of the conventional one.

TABLE 5

| | Peel strength (kg/cm) | Insulation resistance (Ω) | $T_K$ (° C.) |
|---|---|---|---|
| Example 10 | 2.2 | $10^{13}$ | 220 |
| Comparative Example 1 | 1.6 | $10^{11}$ | 180 |

EXAMPLE 11

Application as an interlaminar insulating material for multi-layer printed board (1) A photosensitive dry film (made by DuPont) is laminated on a glass-epoxy plate lined with copper (made by Toshiba Chemical Co., Ltd.) and then a desired conductor circuit pattern is depicted and printed thereon through a mask film under an irradiation of ultraviolet ray. The printed image is developed with 1,1,1-trichloroethane and non-conductor portions are removed with an etching solution of copper chloride and then the dry film is peeled off with methylene chloride. Thus, a first conductor circuit comprised of plural conductor patterns is formed on the substrate to obtain a printed circuit board.

(2) A suspension of epoxy resin particle is obtained by dispersing 200 g of epoxy resin particles (made by Toray Co., Ltd. average particle size: 3.9 μm) into 5 liter of acetone and stirred in a Henshel mixer, during which a suspension obtained by dispersing 300 g of epoxy resin powder (made by Toray Co., Ltd. average particle size: 0.5 μm) in 10 liter of acetone is added dropwise to adhere the epoxy resin powder to the surfaces of the epoxy resin particles. After acetone is removed, the heating at 150° C. is conducted to form quasi-particles. The resulting quasi-particles have an average particle size of about 4.3 μm, in which about 75% by weight of the quasi-particles are existent within a range of ±2 μm around the above average particle size.

(3) 70 parts by weight of 50% acrylated product of cresol-novolac type epoxy resin (made by Yuka Sheel Co., Ltd.), 30 parts by weight of polyether sulphone (PES), 15 parts by weight of diallylterephthalate, 4 parts by weight of 2-methyl-1-[4-(methylthio)phenyl]-2-morpholinopropanone-1 (made by Ciba Geigey), 4 parts by weight of an imidazole type curing agent (made by Shikoku Kasei K.K. trade name: 2E4MZ-CN) and 50 parts by weight of the quasi-particles prepared in the above item (2) are mixed and adjusted to a viscosity of 250 cps in a homodisper agitating machine while adding butylcellosolve and kneaded through three rolls to prepare a solution of photosensitive resin composition.

(4) The solution of photosensitive resin composition is applied on the printed circuit board of the item (1) by means of a knife coater, which is left at a horizontal state for 20 minutes and dried at 70° C. to obtain a photosensitive resin insulating layer having a thickness of about 50 μm.

(5) A photomask film printing black circles of 100 μm in diameter is closed to the printed circuit board of the item (4) and exposed to a super-high pressure mercury lamp of 500 mj/cm², which is subjected to an ultrasonic developing treatment with chlorosene solution to form openings corresponding to viahole of 100 μm in diameter. Further, the printed circuit board is exposed to a super-high pressure mercury lamp of about 3000 mj/cm² and subjected to a heat treatment at 100° C. for 1 hour and 150° C. for 10 hours to form a resin insulating layer having openings corresponding to the photomask film with an excellent size accuracy.

(6) The printed circuit board of the item (5) is immersed in an aqueous solution of chromic acid ($CrO_3$,500 g/l) at 70° C. for 15 minutes to roughen the surface of the resin insulating layer, immersed in a neutral solution (made by Shipley) and washed with water.

(7) A palladium catalyst (made by Shipley) is applied to the roughened surface of the resin insulating layer of the substrate to activate the surface of the insulating layer and immersed in an electroless plating solution for additive having a composition as shown in Table 4 for 11 hours to form an electroless copper plated layer having a thickness of 25 μm.

(8) The steps of the above items (4)–(7) are repeated 2 times to produce multi-layer printed circuit board having 4 printed layers.

COMPARATIVE EXAMPLE 2

Application as an interlaminar insulating material for multi-layer printed board A solution of photosensitive resin composition containing quasi-particles of epoxy resin and having the following resin composition is prepared, and an interlaminar resin insulating layer having a thickness of about 50 μm and an electroless copper plated layer having a thickness of 25 μm are alternately formed on a printed circuit board having a first conductor circuit to prepare a multi-layer printed circuit board having 4 printed layers in the same manner as in Example 11.

[Resin composition]
- 50% acrylated product of cresol-novolac type epoxy resin (made by Yuka Shell Co., Ltd.): 60 parts by weight
- bisphenol-A type epoxy resin (made by Yuka Shell Co., Ltd.): 40 parts by weight
- diallylterephthalate: 15 parts by weight
- 2-methyl-1-[4-(methylthio)phenyl]-2-morpholinopropanone-1(made by Ciba Geigey): 4 parts by weight
- Imidazole type curing agent (made by Shikoku Kasei K.K. trade name: 2P4MHZ): 4 parts by weight The peel strength of the electroless copper plated layer and the insulation resistance and glass transition temperature Tg of the interlaminar resin insulating layer in the build-up multi-layer printed circuit boards of Example 11 and Comparative Example 2 are measured. Furthermore, a heat cycle test of –65° C. ×30 min –125° C. ×30 min is conducted. The obtained results are shown in Table 6.

As seen from the results of Table 6, when the resin composite according to the invention is applied to the resin insulating layer in the build-up multi-layer printed circuit board, the adhesion strength, insulation property, heat resistance and heat cycle property are considerably improved as compared with those of the conventional one.

TABLE 6

| | Peel strength (kg/cm) | Insulation resistance (Ω) | $T_K$ (° C.) | Heat cycle test |
|---|---|---|---|---|
| Example 10 | 2.2 | $10^{13}$ | 220 | >500 |
| Comparative Example 1 | 1.6 | $10^{11}$ | 160 | <400 |

EXAMPLE 12

Epoxy resin/PES system

In the epoxy resin/PES system, 70 parts by weight of cresol-novolac type epoxy resin having an epoxy equivalent of 210–230 (made by Nihon Kayaku K.K. trade name: ECON-103S), 30 parts by weight of polyether sulphone (PES, made by ICI) and 5 parts by weight of an imidazole type curing agent (made by Shikoku Kasei K.K. trade name: 2E4MZ-CN) are mixed in DMF and then cured under conditions of 80° C. for 1 hour and 150° C. for 5 hours to obtain a cured product having a quasi-homogeneous compatible structure.

When the cured resin composite is subjected to TEM observation in the same manner as in Example 4, the particle size of the resin is not more than 0.1 μm.

Furthermore, when the glass transition temperature Tg is measured by dynamic viscoelastic measurement, the peak number of Tg is 1 likewise Example 4.

Moreover, the tensile strength and elongation under tension of the cured resin composite are 995 kg/cm$^2$ and 6.4%, respectively, which are higher than those of the single resin component.

On the other hand, the tensile strength and elongation under tension of the cured resin made of only epoxy resin under the same curing conditions as mentioned above are about 550 kg/cm$^2$ and 3.0%, respectively.

EXAMPLE 13

Epoxy resin/PES system

In the epoxy resin/PES system, bisphenol-A type epoxy resin (made by Yuka Shell Co., Ltd. trade name: Epikote 828) as an epoxy resin, an imidazole type curing agent (made by Shikoku Kasei K.K. trade name: 2E4MZ-CN) as a curing agent are mixed in DMF according to the following composition and then cured under conditions of 80° C. for 1 hour and 150° C. for 5 hours to obtain a cured product having a quasi-homogeneous compatible structure.

Composition: Epikote 828/PES/imidazole type curing agent=70/30/5

When the cured resin composite is subjected to TEM observation in the same manner as in Example 4, the particle size of the resin is not more than 0.1 μm.

Furthermore, when the glass transition temperature Tg is measured by dynamic viscoelastic measurement, the peak number of Tg is 1 likewise Example 4.

Moreover, the tensile strength and elongation under tension of the cured resin composite are 800 kg/cm$^2$ and 7.8%, respectively, which are higher than those of the single resin component.

On the other hand, the tensile strength and elongation under tension of the cured resin made of only epoxy resin under the same curing conditions as mentioned above are about 500 kg/cm$^2$ and 4.5%, respectively.

The resin composite of Example 13 has a dielectric constant of 4.0 and a thermal expansion coefficient of $5.5 \times 10^{-5}$/° C. and can be used as a sealing resin for semiconductor package by mixing with silica powder or the like.

EXAMPLE 14

Epoxy-modified polyimide resin/PSF system

In the epoxy-modified polyimide resin/polysulphone (PSF) system, epoxy-modified polyimide resin (made by Mitsui Petroleu Chemical Industries, Ltd. Trade name: TA-1800) and an imidazole type curing agent (made by Shikoku Kasei K.K. trade name: 2E4MZ-CN) are mixed in DMF according to the following composition and then cured under conditions of 80° C. for 1 hour and 150° C. for 5 hours to obtain a cured product having a quasi-homogeneous compatible structure.

Composition: TA-1800/PSF/imidazole type curing agent= 75/25/5

When the cured resin composite is subjected to TEM observation in the same manner as in Example 4, the particle size of the resin is not more than 0.1 μm.

Furthermore, when the glass transition temperature Tg is measured by dynamic viscoelastic measurement, the peak number of Tg is 1 likewise Example 4.

Moreover, the tensile strength and elongation under tension of the cured resin composite are 980 kg/cm$^2$ and 9.0%, respectively, which are higher than those of the single resin component.

On the other hand, the tensile strength and elongation under tension of the cured resin made of only epoxy resin under the same curing conditions as mentioned above are about 700 kg/cm$^2$ and 6.0%, respectively.

EXAMPLE 15

Photosensitive resin/PES system

In the photosensitive resin/PES system, 100% acrylated product of phenol-novolac type epoxy resin (made by Yuka Shell Co., Ltd.) as a photosensitive resin, dipentaerythritol hexaacrylate (made by Kyoeisha Yushi K.K.) and neopentyl glycol-modified trimethylol propane diacrylate (made by Nihon Kayaku K.K.) as a photosensitive monomer, benzophenone (made by Kanto Kagaku K.K.) as a photoinitiator and Michlars ketone (made by Kanto Kagaku K.K.) are used according to the following composition and cured under the following curing conditions to obtain a cured resin composite.

[Resin Composition]
100% acrylated product of cresol-novolac type epoxy resin: 70 parts by weight
PES: 30 parts by weight
dipentaerythritol hexaacrylate: 10 parts by weight
neopentylglycol-modified trimethylolpropane diacrylate: 5 parts by weight
benzophenone: 5 parts by weight
Michlars ketone: 0.5 part by weight

[Curing conditions]
(i) drying: 80° C.×1 hour
(ii) photocuring: 3 J/cm$^2$
(iii) postcuring: 150° C.×2 hours The tensile strength and elongation under tension of the thus obtained resin composite are 865 kg/cm$^2$ and 6.8%, respectively, which are higher than those of the single resin component.

Moreover, the tensile strength and elongation under tension of the cured product made from only photosensitive resin under the same conditions as mentioned above are about 560 kg/cm$^2$ and 3.1%, respectively.

The peel strength, insulation resistance, glass transition temperature Tg and heat cycle test are evaluated as follows.

(1) Peel strength
It is measured according to JIS-C-6481.

(2) Insulation resistance
A resist pattern is formed by forming an interlaminar insulating layer on the substrate, roughening the surface of the resin layer, applying a catalyst thereto and forming a plated resin thereon. Thereafter, the electroless plating is conducted and an insulation resistance between patterns is measured. In this case, the value of insulation between comb-type patterns of L/S=75/75 μm is measured after 1000 hours at 80° C./85%/24V.

(3) Glass transition temperature Tg
It is measured by dynamic viscoelastic measurement.

(4) Heat cycle test
It is carried out at −65° C.×30 min–125° C.×30 min, during which occurrence of cracks and peel of interlaminar insulating layer are measured. It is evaluated by durable cycle number.

As mentioned above, according to the invention, there can surely be provided novel resin composites possessing properties such as heat resistance or the like inherent to thermosetting resin such as epoxy resin or the like and exhibiting values of properties higher than the properties inherent to thermoplastic resin to be composited such as PES or the like.

And also, the invention can provide novel resin composites possessing properties inherent to photosensitive resin and exhibiting values of properties higher than the properties inherent to thermoplastic resin to be composited such as PES or the like.

What is claimed is:

1. A method of producing a resin composite by curing a photosensitive resin mixed with a thermoplastic resin, wherein the photosensitive resin comprises at least one of methyl polymethacrylate, acrylated phenolic resin, acrylated amino resin, acrylated epoxy resin, acrylated phenoxy resin, acrylated epoxy-modified polyimide resin, acrylated unsaturated polyester resin, acrylated polyimide resin, acrylated urethane resin, and acrylated diallylphthalate resin, which method comprises conducting said curing at a curing rate exceeding a quasi-homogeneous phase forming point determined by photocuring of said photosensitive resin, so that resin particles constituting the resin composite have a particle size of no more than 0.1 μm as measured by transmission electron microscope.

2. The method according to claim 1, wherein an amount of said thermoplastic resin is 15–50 wt %.

3. The method according to claim 1, wherein said photosensitive resin comprises at least one of acrylated phenolic resin, acrylated amino resin, acrylated epoxy resin, acrylated phenoxy resin, acrylated epoxy-modified polyimide resin, acrylated unsaturated polyester resin, acrylated polyimide resin, acrylated urethane resin, and acrylated diallylphthalate resin.

4. The method according to claim 1, wherein said thermoplastic resin comprises polyether sulphone.

5. A method of producing a resin composite by curing a photosensitive resin with a thermoplastic resin, wherein the photosensitive resin comprises at least one of methyl polymethacrylate, acrylated phenolic resin, acrylated amino resin, acrylated epoxy resin, acrylated phenoxy resin, acrylated epoxy-modified polyimide resin, acrylated unsaturated polyester resin, acrylated polyimide resin, acrylated urethane resin, and acrylated diallylphthalate resin, which method comprises conducting said curing at a curing rate exceeding a quasi-homogeneous forming point and a phase separation rate not exceeding the quasi-homogeneous forming point, so that resin particles constituting the resin composite have a particle size of no more than 0.1 μm as measured by transmission electron microscope.

6. The method according to claim 5, wherein an amount of said thermoplastic resin is 15–50 wt %.

7. The method according to claim 5, wherein said photosensitive resin comprises at least one of acrylated phenolic resin, acrylated amino resin, acrylated epoxy resin, acrylated phenoxy resin, acrylated epoxy-modified polyimide resin, acrylated unsaturated polyester resin, acrylated polyimide resin, acrylated urethane resin, and acrylated diallylphthalate resin.

8. The method according to claim 5, wherein said thermoplastic resin comprises polyether sulphone.

9. The method according to claim 1, wherein the peak number of the glass transition temperature of the resin composite, as measured by dynamic viscoelasticity under conditions wherein a vibration frequency is 6.28 rad/sec and a temperature rising rate is 5° C./min, is 1.

10. The method according to claim 2, wherein the peak number of the glass transition temperature of the resin composite, as measured by dynamic viscoelasticity under conditions wherein a vibration frequency is 6.28 rad/sec and a temperature rising rate is 5° C./min, is 1.

11. The method according to claim 3, wherein the peak number of the glass transition temperature of the resin composite, as measured by dynamic viscoelasticity under conditions wherein a vibration frequency is 6.28 rad/sec and a temperature rising rate is 5° C./min, is 1.

12. The method according to claim 4, wherein the peak number of the glass transition temperature of the resin composite, as measured by dynamic viscoelasticity under conditions wherein a vibration frequency is 6.28 rad/sec and a temperature rising rate is 5° C./min, is 1.

13. The method according to claim 1, wherein the resin composite is formed by compositing the photosensitive resin and thermoplastic resin so as not to form a co-continuous two-phase spherical domain structure due to phase separation.

14. The method according to claim 2, wherein the resin composite is formed by compositing the photosensitive resin and thermoplastic resin so as not to form a co-continuous two-phase spherical domain structure due to phase separation.

15. The method according to claim 3, wherein the resin composite is formed by compositing the photosensitive resin and thermoplastic resin so as not to form a co-continuous two-phase spherical domain structure due to phase separation.

16. The method according to claim 4, wherein the resin composite is formed by compositing the photosensitive resin and thermoplastic resin so as not to form a co-continuous two-phase spherical domain structure due to phase separation.

17. The method according to claim 1, wherein the thermoplastic resin comprises at least one of polyether sulphone, polysulphone, polyether imide, polystyrene, polyethylene, polyarylate, polyamidoimide, polyphenylene sulfide, polyether ketone, polyoxybenzoate, polyvinyl chloride, polyvinyl acetate, polyacetal, and polycarbonate.

18. The method according to claim 5, wherein the peak number of the glass transition temperature of the resin composite, as measured by dynamic viscoelasticity under conditions wherein a vibration frequency is 6.28 rad/sec and a temperature rising rate is 5° C./min, is 1.

19. The method according to claim 5, wherein the resin composite is formed by compositing the photosensitive resin and thermoplastic resin so as not to form a co-continuous two-phase spherical domain structure due to phase separation.

20. The method according to claim 5, wherein the thermoplastic resin comprises at least one of polyether sulphone, polysulphone, polyether imide, polystyrene, polyethylene, polyarylate, polyamidoimide, polyphenylene sulfide, polyether ketone, polyoxybenzoate, polyvinyl chloride, polyvinyl acetate, polyacetal, and polycarbonate.

* * * * *

UNITED STATES PATENT AND TRADEMARK OFFICE
CERTIFICATE OF CORRECTION

PATENT NO. : 6,306,980 B1
DATED : October 23, 2001
INVENTOR(S) : D. D. Wang et al.

It is certified that error appears in the above-identified patent and that said Letters Patent is hereby corrected as shown below:

<u>Title page,</u>
Item [57], ABSTRACT,
Line 4, "guasi-homogeneous" should be -- quasi-homogeneous --

Signed and Sealed this

Eighteenth Day of June, 2002

*Attest:*

JAMES E. ROGAN
*Attesting Officer*     *Director of the United States Patent and Trademark Office*